US012675145B2

(12) United States Patent　　　　　(10) Patent No.:　　US 12,675,145 B2
　　Grandhi et al.　　　　　　　　　　(45) Date of Patent:　　　Jul. 7, 2026

(54) ACTIVE THERMAL CONTROL FOR A SYSTEM ON A CHIP (SOC)

(71) Applicant: QUALCOMM Incorporated, San Diego, CA (US)

(72) Inventors: Tejas Grandhi, Bangalore (IN); Prashanth Kumar Kakkireni, Bengaluru (IN); Tejaswini Shenoy, Bangalore (IN); Venkatesh Ravipati, Guntur (IN)

(73) Assignee: QUALCOMM Incorporated, San Diego, CA (US)

( * ) Notice: Subject to any disclaimer, the term of this patent is extended or adjusted under 35 U.S.C. 154(b) by 410 days.

(21) Appl. No.: 18/393,189

(22) Filed: Dec. 21, 2023

(65) Prior Publication Data

US 2025/0208673 A1　　Jun. 26, 2025

(51) Int. Cl.
　　*G06F 1/20*　　　　(2006.01)
　　*H05K 7/20*　　　　(2006.01)
(52) U.S. Cl.
　　CPC ........... *G06F 1/20* (2013.01); *H05K 7/20209* (2013.01)

(58) Field of Classification Search
　　CPC ........ G06F 1/20; G06F 1/206; H05K 7/20209
　　See application file for complete search history.

(56) References Cited

U.S. PATENT DOCUMENTS

2019/0239384 A1*　8/2019　North ..................... G06F 1/3296
2020/0088793 A1*　3/2020　Montero .................. G06F 1/20

* cited by examiner

*Primary Examiner* — Bao Long T Nguyen
(74) *Attorney, Agent, or Firm* — Loza Y Loza LLP

(57)　　　　　　　ABSTRACT

Aspects of the disclosure are directed to active thermal control for a system on a chip (SOC). In accordance with one aspect, an internal fan controller is configured to generate a fan pulse width modulation (PWM) signal, wherein the internal fan controller is integrated as part of a system on a chip (SOC); a fan module is configured to generate one or more tachometer pulses; and an internal tachometer coupled to the internal fan controller and the fan module, the internal tachometer is configured to receive the one or more tachometer pulses from the fan module, wherein the internal tachometer is integrated as part of the system on a chip (SOC).

30 Claims, 10 Drawing Sheets

100

105

| HW | Internal HW Blocks | Size | Function | Clock | Rail | HW Location |
|---|---|---|---|---|---|---|
| | TACH_ Counter  426 | 11-bit | • Count TACH Pulses from FAN | | | |
| | TACH Counter Configuration register | 16-bit | • To configure Tach_counter | | | |
| | TACH_ Timer  425 | 32-bit | • Provide Programmable Time interval for TACH_COUNTER to count TACH Pulses.<br>• Must be capable of programming count of 100msec to 1sec in the step size of 1msec | | | |
| TACH | TACH Timer Configuration register | 16-bit | To configure TACH_TIMER | Sleep Clock | MXA | CHIP_ TOP (SOC) |
| | RPM Checker  428 | 16-bit | • Convert TACH Counts to FAN RPM value and compare against Target_RPM and raise an appropriate interrupt to QFAN_CTRL | | | |
| | Target_ RPM CSR  429a | 16-bit | • QFAN CTRL must update the Target RPM value into this CSR. | | | |
| | TACH_RPM CSR  429b | 16-bit | • RPM Checker will write TACH RPM after processing tach pulses from tach counter | | | |

FIG. 4 (cont)

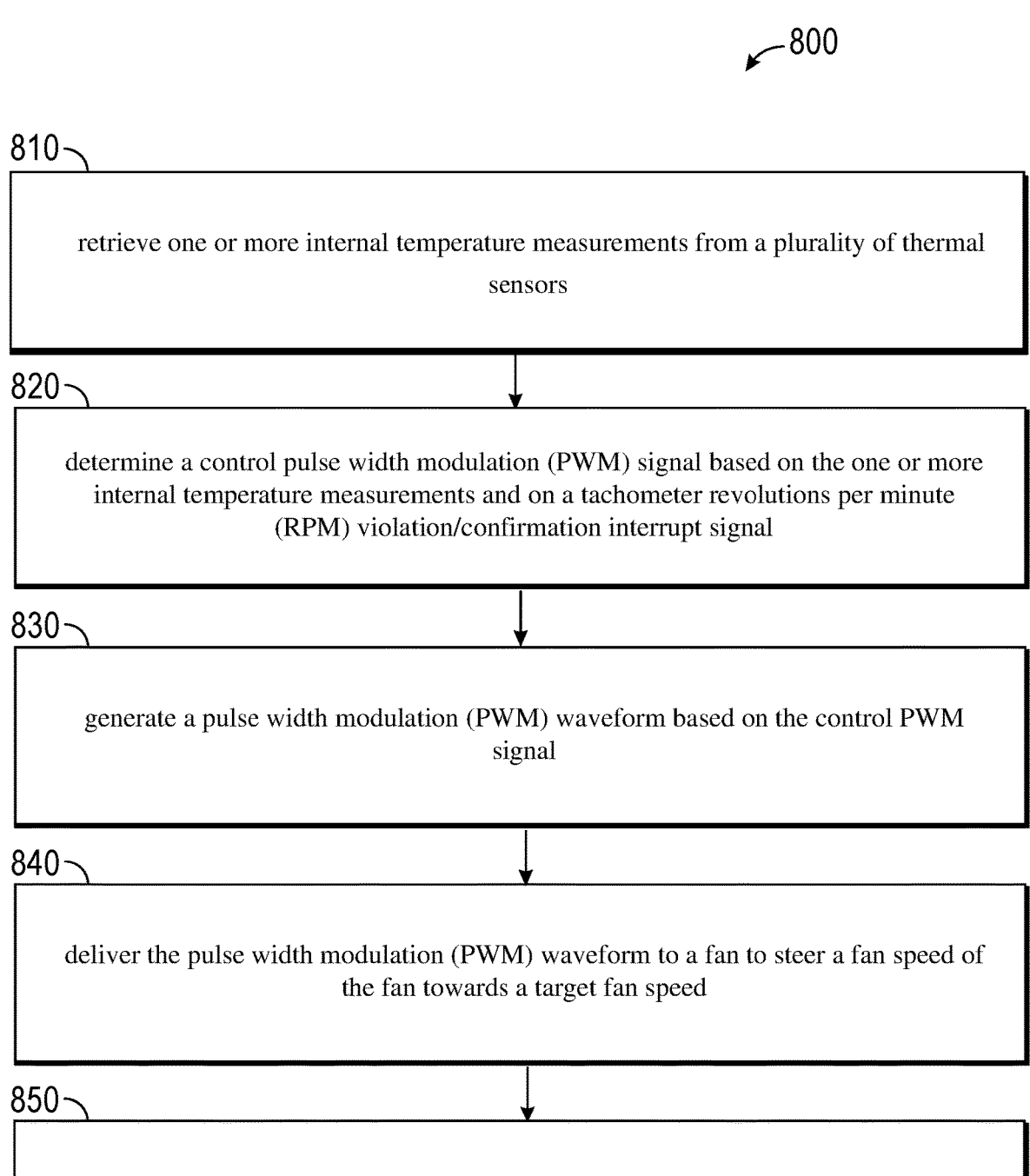

810 — retrieve one or more internal temperature measurements from a plurality of thermal sensors 820 — determine a control pulse width modulation (PWM) signal based on the one or more internal temperature measurements and on a tachometer revolutions per minute (RPM) violation/confirmation interrupt signal 830 — generate a pulse width modulation (PWM) waveform based on the control PWM signal 840 — deliver the pulse width modulation (PWM) waveform to a fan to steer a fan speed of the fan towards a target fan speed 850 — provide one or more tachometer pulses from the fan as a fan speed feedback to an internal tachometer

FIG. 8

SOC Thermal
Cooling Fan
940

User Experience Fan
950

To Air Flow Vents on
User's Face

ACTIVE THERMAL CONTROL FOR A SYSTEM ON A CHIP (SOC)

TECHNICAL FIELD

This disclosure relates generally to the field of information processing systems, and, in particular, to active thermal control for a system on a chip (SOC) within the information processing system.

BACKGROUND

Information processing systems may include multiple processing engines, processors or processing cores for a variety of user applications. An information processing system may include a central processing unit (CPU), a graphics processing unit (GPU), a digital signal processor (DSP), an image signal processor (ISP), a neural processing unit (NPU), etc., along with input/output interfaces, a hierarchy of memory units and associated interconnection data-buses. In addition, the information processing system may include a plurality of peripheral devices which communicate with a processing engine using a plurality of high-speed interfaces. In one example, the information processing system may include a system on a chip (SOC) which is a single integrated circuit (IC) which hosts a plurality of processing engines within a single chip. Operational temperature of the SOC is determined by the dc power consumption of the SOC which depends on the processing load at a given time. Thus, proper functioning of the SOC may require some type of active thermal management and control process which monitors the SOC temperature and regulates the SOC temperature by active thermal control.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides active thermal control for a system on a chip (SOC). Accordingly, an apparatus including: an internal fan controller configured to generate a fan pulse width modulation (PWM) signal, wherein the internal fan controller is integrated as part of a system on a chip (SOC); a fan module configured to generate one or more tachometer pulses; and an internal tachometer coupled to the internal fan controller and the fan module, the internal tachometer configured to receive the one or more tachometer pulses from the fan module, wherein the internal tachometer is integrated as part of the system on a chip (SOC).

In one example, the apparatus further includes a core power management integrated circuit (PMIC) coupled to the internal fan controller, the core PMIC configured to receive the fan PWM signal and to generate a control pulse width modulation (PWM) signal based on the fan PWM signal. In one example, the apparatus further includes a pulse width modulation (PWM) generator configured to generate a pulse width modulation (PWM) waveform based on the control PWM signal.

In one example, the fan module is further configured to receive the PWM waveform. In one example, In one example, the fan module comprises a fan. In one example, the fan module is further configured to use the PWM waveform to steer a fan speed of the fan towards a target fan speed. In one example, the fan module is further configured to provide the one or more tachometer pulses as a fan speed feedback to the internal tachometer.

In one example, the apparatus further includes a tachometer counter configured to count the one or more tachometer pulses, wherein the tachometer counter is a component of the internal tachometer. In one example, the apparatus further includes a tachometer timer configured to synchronize the tachometer counter, wherein the tachometer timer is a component of the internal tachometer.

In one example, the tachometer timer is further configured to provide a programmable time interval for the tachometer counter. In one example, the internal tachometer is further configured to derive a fan speed measurement from the fan speed feedback. In one example, the internal tachometer is further configured to generate a tachometer revolutions per minute (RPM) violation/confirmation interrupt signal based on a comparison of the fan speed measurement and a target RPM value.

In one example, the internal fan controller is further configured to use a thermal control algorithm for determining the control PWM signal. In one example, the thermal control algorithm is based on a system on a chip (SOC) temperature interrupt signal and a chipset temperature interrupt signal.

Another aspect of the disclosure provides a method including: determining a control pulse width modulation (PWM) signal based on one or more internal temperature measurements and based on a tachometer revolutions per minute (RPM) violation/confirmation interrupt signal; generating a pulse width modulation (PWM) waveform based on the control PWM signal; delivering the pulse width modulation (PWM) waveform to a fan to steer a fan speed of the fan towards a target fan speed; and providing one or more tachometer pulses from the fan as a fan speed feedback to an internal tachometer.

In one example, the method further includes retrieving the one or more internal temperature measurements from a plurality of thermal sensors. In one example, the one or more internal temperature measurements include a system on a chip (SOC) temperature or a chipset temperature.

In one example, the method further includes deriving a fan speed measurement from the fan speed feedback. In one example, the tachometer RPM violation/confirmation interrupt signal is based on the fan speed measurement. In one example, the tachometer RPM violation/confirmation interrupt signal is based on a comparison of the fan speed measurement and a target RPM value.

In one example, the method further includes using a thermal control algorithm for determining the control PWM signal. In one example, the thermal control algorithm is based on a system on a chip (SOC) temperature interrupt signal and a chipset temperature interrupt signal. In one example, the thermal control algorithm is based on the tachometer RPM violation/confirmation interrupt signal.

In one example, the PWM waveform is a periodic pulse train. In one example, the periodic pulse train includes a switching frequency and includes a variable pulse width.

In one example, the method further includes using the PWM waveform to regulate a thermal control duty cycle. In one example, the method further includes incorporating a closed loop control process to incorporate the fan speed feedback from the fan to an internal fan controller.

Another aspect of the disclosure provides an apparatus for providing active thermal control for a system on a chip (SOC), the apparatus including: means for determining a control pulse width modulation (PWM) signal based on one or more internal temperature measurements and based on a tachometer revolutions per minute (RPM) violation/confirmation interrupt signal; means for generating a pulse width modulation (PWM) waveform based on the control PWM signal; means for delivering the pulse width modulation (PWM) waveform to a fan to steer a fan speed of the fan towards a target fan speed; means for providing one or more tachometer pulses from the fan as a fan speed feedback to an internal tachometer; and a plurality of thermal sensors configured for retrieving the one or more internal temperature measurements. In one example, the apparatus further includes means for using a thermal control algorithm for determining the control PWM signal, wherein the thermal control algorithm is based on a system on a chip (SOC) temperature interrupt signal and a chipset temperature interrupt signal.

Another aspect of the disclosure provides a non-transitory computer-readable medium storing computer executable code, operable on a device including at least one processor and at least one memory coupled to the at least one processor, wherein the at least one processor is configured to implement active thermal control for a system on a chip (SOC), the computer executable code including: instructions for causing a computer to determine a control pulse width modulation (PWM) signal based on one or more internal temperature measurements and based on a tachometer revolutions per minute (RPM) violation/confirmation interrupt signal; instructions for causing the computer to generate a pulse width modulation (PWM) waveform based on the control PWM signal; instructions for causing the computer to deliver the pulse width modulation (PWM) waveform to a fan to steer a fan speed of the fan towards a target fan speed; instructions for causing the computer to provide one or more tachometer pulses from the fan as a fan speed feedback to an internal tachometer; instructions for causing the computer to retrieve the one or more internal temperature measurements from a plurality of thermal sensors; and instructions for causing the computer to use a thermal control algorithm for determining the control PWM signal, wherein the thermal control algorithm is based on a system on a chip (SOC) temperature interrupt signal and a chipset temperature interrupt signal.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

FIG. 8 illustrates an example flow diagram for active thermal control of a system on a chip (SOC).

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

An information processing system, for example, a computing system with multiple slices (e.g., processing engines) or a system on a chip (SoC), may require multiple levels of coordination or synchronization. In one example, a slice may include a processing engine (i.e., a subset of the computing system) as well as associated memory units and other peripheral devices. In one example, execution of an application may be decomposed into a plurality of work tasks which are executed by multiple slices or multiple processing engines.

Figure 1:
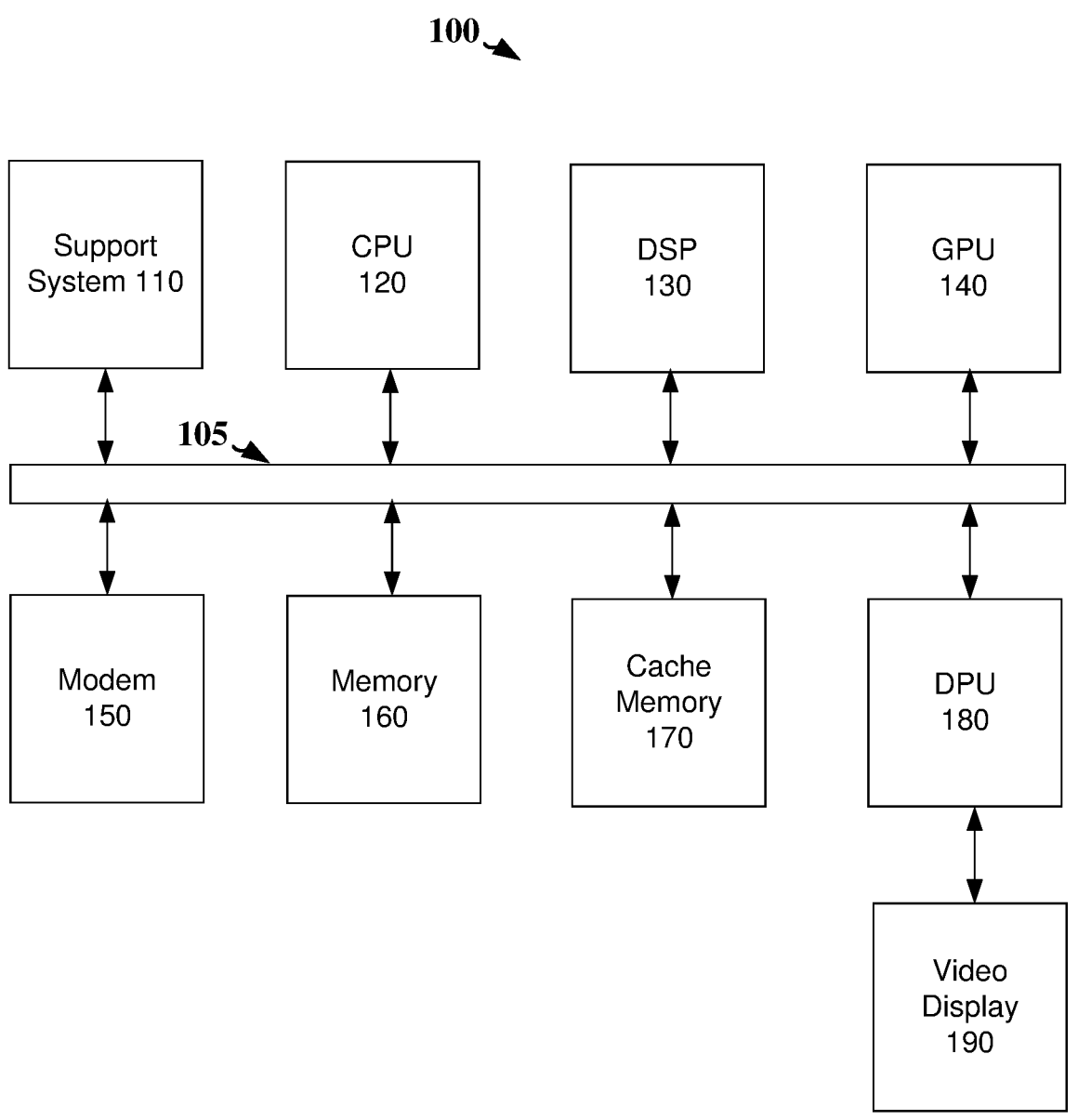
FIG. 1 illustrates an example information processing system.

FIG. 1 illustrates an example information processing system 100. In one example, the information processing system 100 includes a plurality of processing engines such as a central processing unit (CPU) 120, a digital signal processor (DSP) 130, a graphics processing unit (GPU) 140, a display processing unit (DPU) 180, etc. In one example, various other functions in the information processing system 100 may be included such as a support system 110, a modem 150, a memory 160, a cache memory 170 and a video display 190. For example, the plurality of processing engines and various other functions may be interconnected by an interconnection databus 105 to transport data and control information.

In one example, the memory 160 and/or the cache memory 170 may be shared among the CPU 120, the GPU 140 and the other processing engines. In one example, the CPU 120 may include a first internal memory which is not shared with the other processing engines. In one example, the GPU 140 may include a second internal memory which is not shared with the other processing engines. In one example, any processing engine of the plurality of processing engines may have an internal memory (i.e., a dedicated memory) which is not shared with the other processing engines. Although several components of the information processing system 100 are included herein, one skilled in the art would understand that the components listed herein are examples and are not exclusive. Thus, other components may be included as part of the information processing system 100 within the spirit and scope of the present disclosure.

In one example, one or more processing engines in the information processing system 100 may be aggregated into a single integrated circuit known as a system on a chip (SOC). In one example, the SOC may include the central processing unit (CPU) 120 and other processing engines such as the DSP 130 or the GPU 140. The SOC may also include the memory 160 and the cache memory 170.

In one example, the information processing system 100 may be part of a wireless device in a wireless communication system. For example, the wireless communication system may conform to a wireless network protocol such as 4G LTE (long term evolution), 5G NR (new radio), etc.

In one example, a processing load (i.e., number of processing operations per unit time) of the SOC may be dynamic. That is, the processing load of the SOC may vary over time between a fully operational mode (e.g., maximum number of processing operations per unit time) to an idle mode (e.g., only standby operations). In one example, dc power consumption of the SOC is directly dependent on the processing load of the SOC. That is, the SOC may demand a higher dc power consumption when in a fully operational mode and may demand a lower dc power consumption when in an idle mode. Since not all of the dc power consumption is converted to useful electronic energy for processing, much of the dc power consumption is converted into thermal energy. Thus, variable dc power consumption translates into variable thermal energy conversion which results in a time-varying operational temperature profile of the SOC.

In one example, active thermal management and control of the SOC is required to maintain a SOC operational temperature T within a specified temperature range between a minimum operational temperature $T_{min}$ and a maximum operational temperature $T_{max}$. In one example, if the SOC operational temperature T is outside the specified temperature range (i.e., $T<T_{min}$ or $T>T_{max}$), appropriate thermal management may be performed to steer the SOC operational temperature T within the specified temperature range. For example, appropriate thermal management may include engaging or disengaging thermal control devices or actuators such as heaters, fans, heat pipes, etc.

Figure 2:
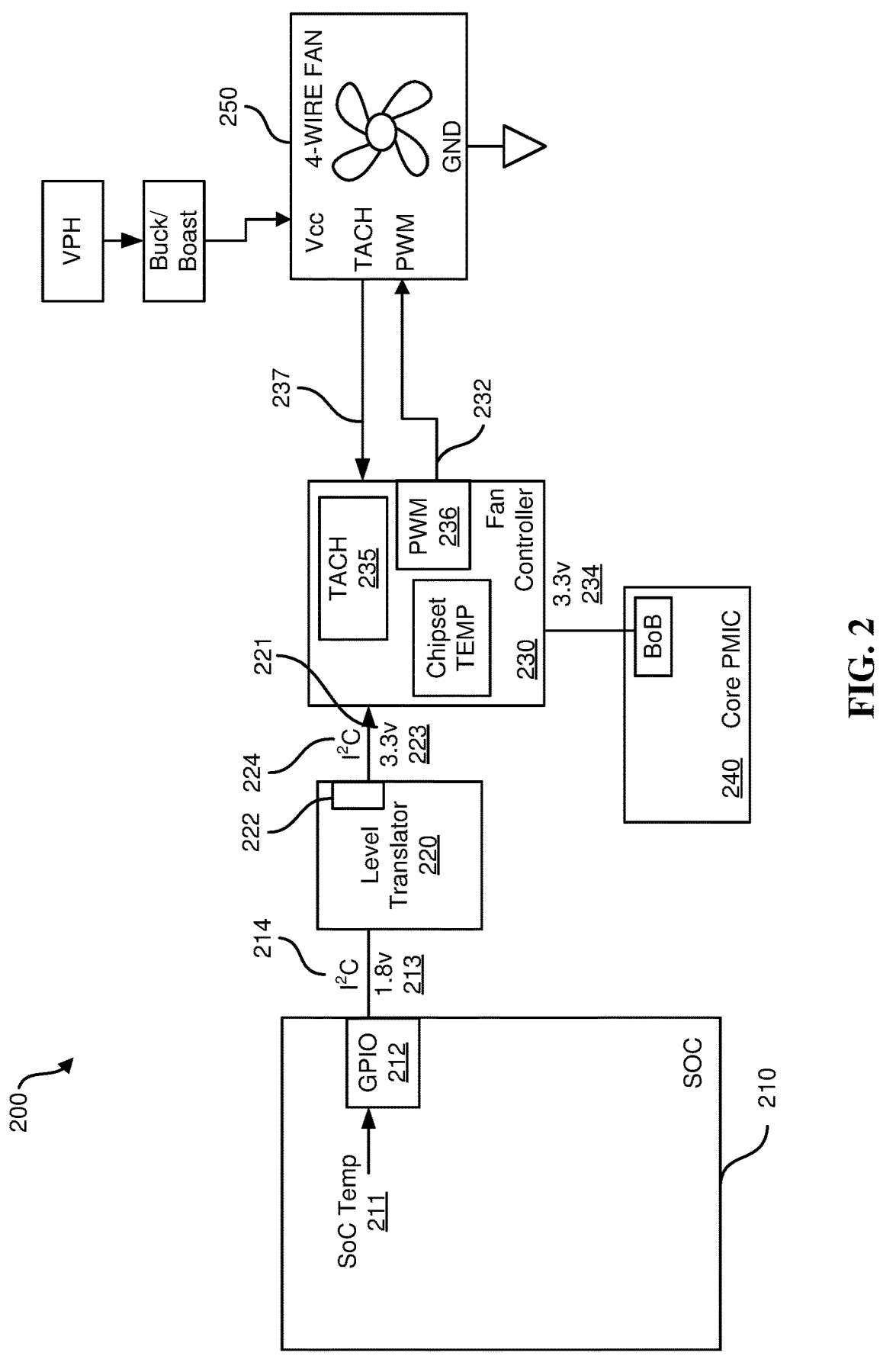
FIG. 2 illustrates a first example implementation of active thermal control of a system on a chip (SOC).

FIG. 2 illustrates a first example implementation 200 of active thermal control of a system on a chip (SOC). In one example, a SOC 210 executes operations for a user application as part of an information processing system. In one example, the SOC 210 provides a SOC temperature signal 211 to represent a SOC operational temperature T. In one example, the SOC 210 delivers the SOC temperature signal 211 to a first output interface 212 (e.g., a general purpose input output (GPIO) interface). In one example, the first output interface 212 operates at a first output voltage level 213 (e.g., +1.8 v dc) and conforms to a first signaling protocol 214 (e.g., inter-integrated circuit (I²C)).

In one example, the SOC temperature signal 211 is received by a level translator 220. In one example, a second output interface 222 of the level translator 220 operates at a second output voltage level 223 (e.g., +3.3 v dc) and conforms to a second signaling protocol 224 (e.g., I²C).

In one example, the level translator 220 delivers an adjusted SOC temperature signal 221 through the second output interface 222 to a fan controller 230. In one example, the fan controller 230 receives a tachometer signal 237 which is sent to a tachometer module 235. In one example, the tachometer module 235 processes the tachometer signal 237 to obtain a fan speed measurement 238 (not shown). In one example, the fan controller 230 executes a thermal control algorithm based on the adjusted SOC temperature signal 221 and the fan speed measurement 238 (not shown). In one example, the thermal control algorithm generates a pulse width modulation (PWM) signal 236 and delivers it to a third output interface 232. In one example, the fan controller 230 also receives a supply voltage 234 (e.g., +3.3 v dc) from a core power management integrated circuit (PMIC) 240.

In one example, a core PMIC module 240 provides the supply voltage 234 to the fan controller 230. In one example, a fan 250 receives the PWM signal 236 from the fan controller 230 and sends the tachometer signal 237 to the fan controller. In one example, the pulse width characteristics of the PWM signal 236 are used to regulate a fan speed of the fan 250. For example, increasing the pulse width over time increases the fan speed of the fan 250. For example, decreasing the pulse width over time decreases the fan speed of the fan 250.

In one example, active thermal control is executed by an embedded controller (EC) or a microcomputer unit (MCU), for example, fan controller 230 in FIG. 2. For example, usage of a separate embedded controller or MCU may require a higher part count (i.e., higher recurring manufacturing costs) and a larger PCB area. In one example, because of the greater distance between the SOC (e.g., which executes user application operations) and the separate embedded controller or MCU (e.g., which controls fan operation) increases signaling distance and adds to processing latency due to increased signal propagation delays.

Figure 3:
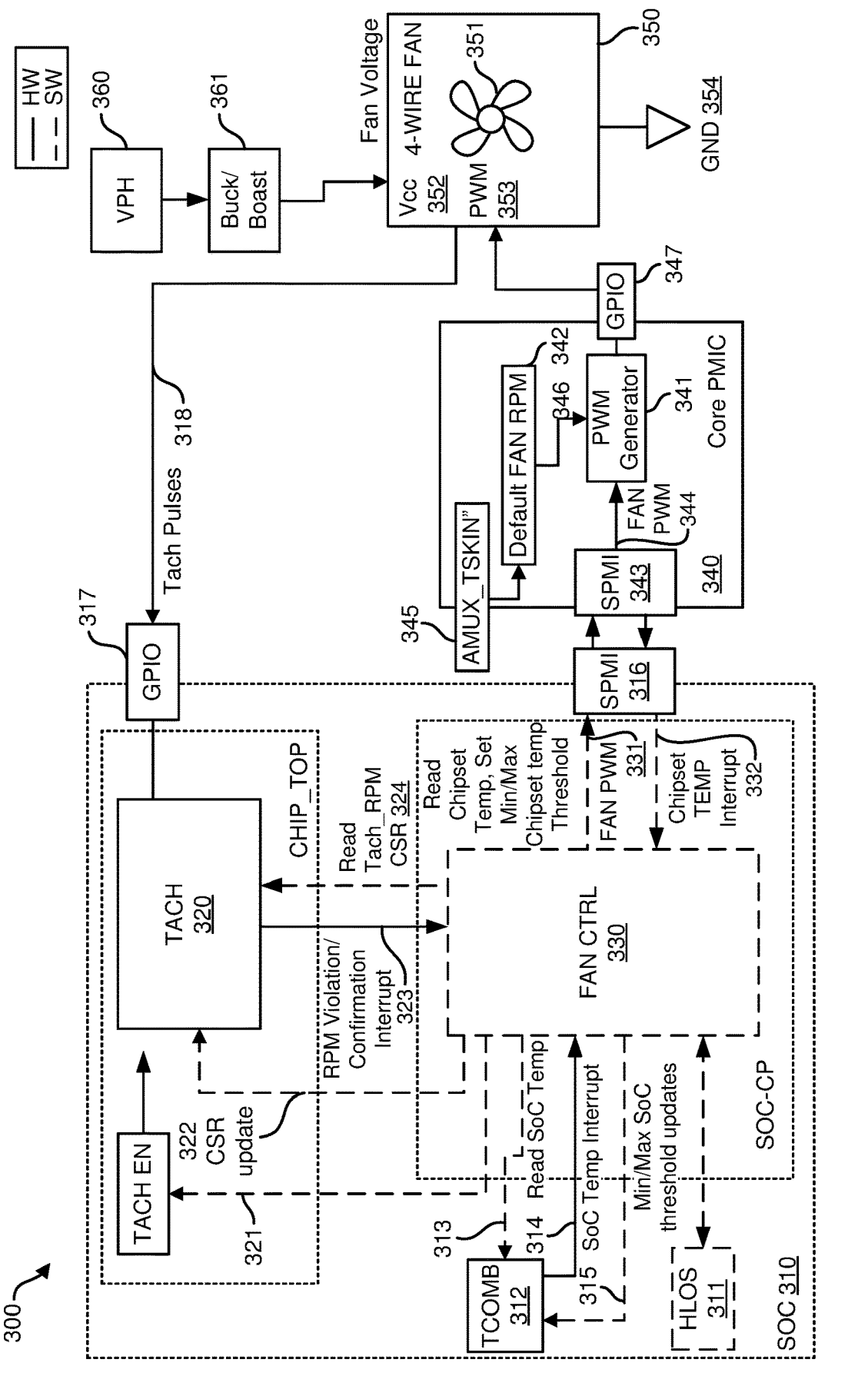
FIG. 3 illustrates a second example implementation of active thermal control of a system on a chip (SOC).

FIG. 3 illustrates a second example implementation 300 of active thermal control of a system on a chip (SOC). In one example, the second example implementation of active thermal control of a SOC utilizes an internal fan controller based on both hardware and software control. In one example, a SOC 310 executes operations for a user application as part of an information processing system. In one example, the SOC 310 includes an internal tachometer 320 and an internal fan controller 330.

In one example, the second implementation of active thermal control of a SOC 300 enables aggressive temperature control for the SOC 310 since the active thermal control function is now integrated as part of the SOC (i.e., it is an internal active thermal control system). For example, the SOC 310 may have full knowledge of active user applications and use cases and direct knowledge of an internal temperature state, e.g., SOC temperature measurements. In one example, the internal temperature state is a plurality of temperature measurements for the SOC. For example, this knowledge may be used to execute active thermal control actions which steer the SOC temperature to a desired state more quickly and more efficiently. As a result, higher SOC performance for longer time durations may be attained.

In one example, the SOC 310 may include a high-level operating system (HLOS) 311 which provides software management and control of the internal fan controller 330. For example, the HLOS executes on a central processing unit (CPU) within the SOC 310. In one example, the SOC 310 includes a thermal combiner module 312. In one example, the thermal combiner (TCOMB) module 312 receives a read SOC temperature request signal 313 from the internal fan controller 330. And, in one example, the thermal combiner (TCOMB) module 312 sends a SOC temperature interrupt signal 314 to the internal fan controller 330. In one example, the SOC temperature interrupt signal 314 indicates a breach of a SOC junction temperature threshold. In addition, the thermal combiner module 312 receives maximum/minimum SOC threshold updates 315 from the internal fan controller 330.

In one example, the internal tachometer 320 receives tachometer pulses 318 from a fan module 350 over a first input interface 317 (e.g., first GPIO interface). In one example, the internal tachometer 320 processes the tachometer pulses 318 to derive a fan speed measurement in units of revolutions per minute (RPM). In one example, the internal tachometer 320 receives a tachometer enable (TACH_EN) signal 321 from the internal fan controller 330 to enable tachometer operations. In one example, the internal tachometer 320 receives a control/status register (CSR) update signal 322 from the internal fan controller 330 to update tachometer configuration information. In one example, the tachometer configuration information includes a target RPM (i.e., target fan speed) value.

In one example, the tachometer 320 compares the fan speed measurement to the target RPM value and executes necessary actions. In one example, a first necessary action may be a generation of a RPM confirmation interrupt if the fan speed measurement equals the target RPM value (i.e., the fan is running at the set speed). In one example, a second necessary action may be a generation of a violation interrupt if the fan speed measurement does not equal the target RPM value (i.e., the fan speed is mismatched to the target RPM value). In one example, the internal tachometer 320 receives a read tachometer RPM/CSR request signal 324 from the internal fan controller 330 to the internal tachometer 320. In one example, the internal tachometer 320 sends a tachometer revolutions per minute (RPM) violation/confirmation interrupt signal 323 to the internal fan controller 330. In one example, the tachometer RPM violation/confirmation interrupt signal 323 is a two wire interrupt signal with a first wire containing a RPM confirmation interrupt and a second wire containing a RPM violation interrupt. In one example, the internal fan controller 330 reads the read tachometer RPM/CSR request signal 324 from the internal tachometer 320 and determines a delta RPM and adjusts a fan PWM signal 331 accordingly.

In one example, the internal fan controller 330 accepts the SOC temperature interrupt signal 314 and a chipset temperature interrupt signal 332 from a core power management integrated circuit (PMIC) 340 for processing to produce a fan pulse width modulation (PWM) signal 331 over a first output interface 316 (e.g., a first System Power Management Interface (SPMI) interface) to the core PMIC 340. In one example, the fan PWM signal 331 also depends on the tachometer RPM violation/confirmation interrupt signal 323. In one example, the internal fan controller 330 executes a thermal control algorithm based on the SOC temperature interrupt signal 314 and the chipset temperature interrupt signal 332. In one example, the thermal control algorithm is also based on the tachometer RPM violation/confirmation interrupt signal 323. In one example, the thermal control algorithm generates the fan PWM signal 331. In one example, the chipset temperature interrupt signal 332 is an indication from the core PMIC 340 if a breach in one or more chipset temperatures (e.g., measured through thermistors).

In one example, the fan PWM signal 331 depends on knowledge of active user applications and use cases and direct knowledge of an internal temperature state. In one example, knowledge of active user applications and use cases means that current processing activity in the SOC provides information on internal thermal energy consumption. In one example, direct knowledge of the internal temperature state means that internal temperature measurements are used to determine the internal temperature state.

In one example, the fan PWM signal 331 is used to convey a fan speed directive to the core PMIC 340. In one example, the internal fan controller 330 sends the read SOC temperature request signal 313 to the TCOMB 312 to obtain SOC temperature. In one example, the internal fan controller 330 sends the maximum/minimum SOC threshold updates 315 to the TCOMB 312.

In one example, the core PMIC 340 receives the fan PWM signal 331 at a second input interface 343 (e.g., a second System Power Management Interface (SPMI) interface) to produce a control PWM signal 344. In one example, the control PWM signal 344 is used in a PWM generator 341 to generate a PWM waveform 353 at a second output interface 347 (e.g., a second GPIO interface). In one example, the PWM generator 341 also receives a default fan RPM setting 342 at a third input interface 346. In one example, the default fan RPM setting 342 is initialized at interface 345. In one example, the interface 345 is an analog-digital converter (ADC) channel in the core PMIC 340 which connects to a thermistor which is placed to measure a skin temperature of a printed circuit board (PCB) hardware temperature. In one example, if there is a breach in a measured skin temperature, then the core PMIC 340 will enable the fan in the default fan RPM setting 342.

In one example, the fan module 350 includes a multiblade fan 351, a fan voltage input 352, the PWM waveform 353 and a power ground input 354. In one example, the fan voltage input 352 is obtained from a primary dc voltage source 360 which feeds a primary voltage signal to a buck/boost voltage converter 361 for voltage conditioning (e.g., voltage regulation and voltage conversion). In one example, the pulse width characteristics of the PWM waveform 353 are used to regulate a fan speed of the multi-blade fan 351. For example, increasing the pulse width over time increases the fan speed of the multi-blade fan 351. For example, decreasing the pulse width over time decreases the fan speed of the multi-blade fan 351.

In one example, the PWM waveform steers a fan speed of the fan towards a target RPM value (i.e., target fan speed). In one example, the steering is performed by incorporating fan speed feedback from the fan to an internal fan controller which incorporates a closed loop control process.

Figure 4:
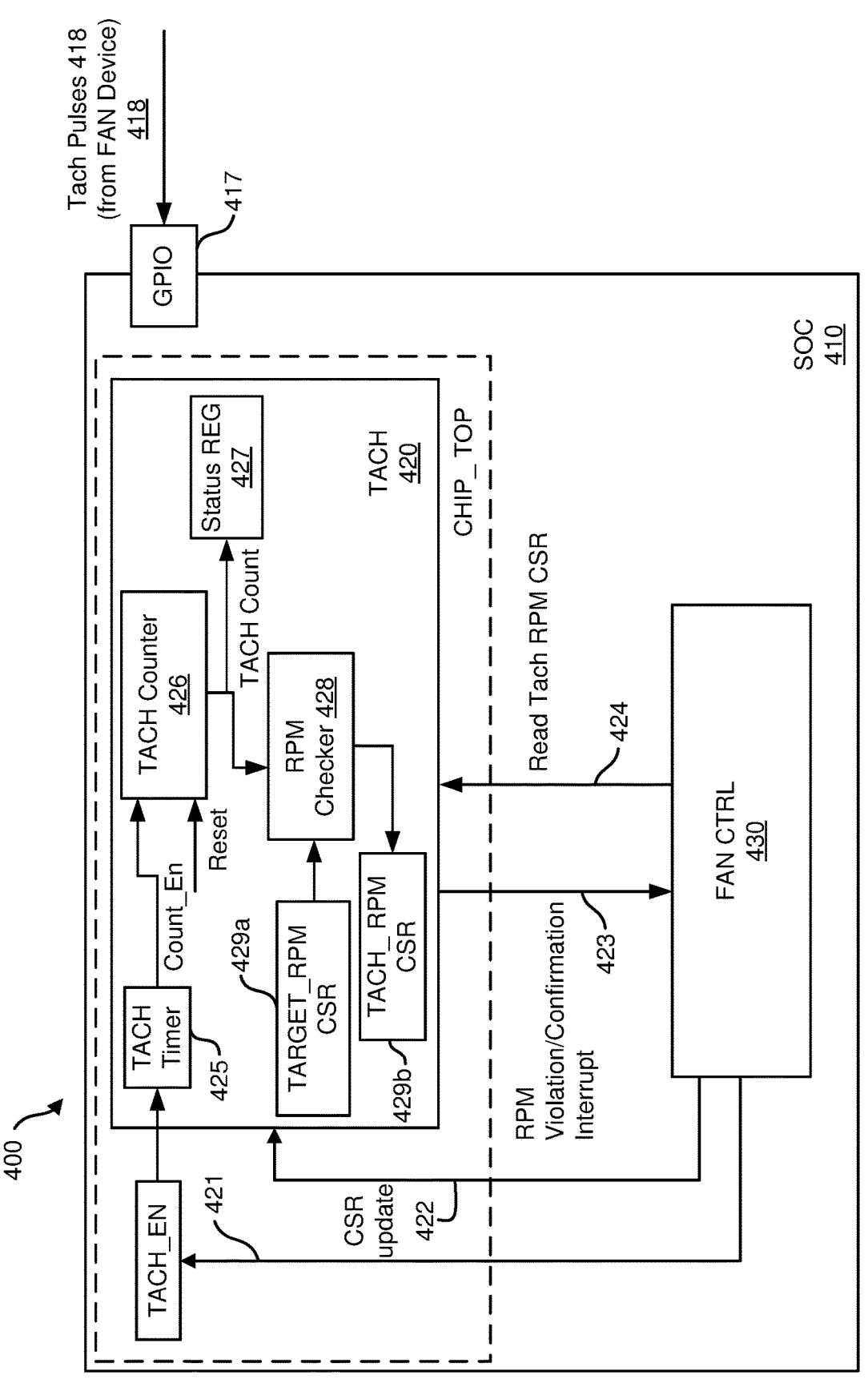
FIG. 4 illustrates an example block diagram for a system on a chip (SOC) with an internal tachometer.

FIG. 4 illustrates an example block diagram 400 for a system on a chip (SOC) with an internal tachometer. In one example, a SOC 410 includes an internal tachometer 420 and an internal fan controller 430. For example, the internal tachometer 420 may operate with a clock with a frequency set for a sleep mode.

In one example, the internal tachometer 420 receives tachometer pulses 418 from a fan module 450 (not shown) over a first input interface 417 (e.g., first GPIO interface). In one example, the internal tachometer 420 processes the tachometer pulses 418 to derive a fan speed measurement in units of revolutions per minute (RPM). In one example, the internal tachometer 420 receives a tachometer enable (TACH_EN) signal 421 from the internal fan controller 430 to enable tachometer operations. In one example, the internal tachometer 420 receives a control/status register (CSR) update signal 422 from the internal fan controller 430 to update tachometer configuration information. In one example, the tachometer configuration information includes a target RPM value (i.e., target fan speed). In one example, the tachometer 420 compares the fan speed measurement to the target RPM value. In one example, the internal tachometer 420 receives a read tachometer RPM/CSR request signal 424 from the internal fan controller 330. In one example, the internal tachometer 420 sends a tachometer RPM violation/confirmation interrupt signal 423 to the internal fan controller 430.

In one example, the TACH_EN signal 421 is received by a tachometer timer 425 which produces a Count Enable (Count_En) signal sent to a tachometer counter 426. In one example, the tachometer timer 425 has a size of J bits (e.g., J=11) and the tachometer counter 426 has a size of K bits (e.g., K=32). In one example, the tachometer counter 426 also receives a reset signal for clearing of its counter. In one example, the tachometer counter 426 receives the tachometer pulses 418 to provide a tachometer count (TACH Count) to a status register 427 and an RPM checker 428. In one example, the RPM checker 428 has a size of L bits (e.g., L=16). In one example, the tachometer pulses 418 are counted by the tachometer counter 426 and synchronized by the Count Enable signal to provide the tachometer count.

In one example, the Count Enable signal from the tachometer timer 425 provides a programmable time interval for the tachometer counter 426 to count the tachometer pulses 418. For example, the programmable time interval may range from 100 ms to 1 second with a time resolution Δt. In one example, the time resolution Δt is a fraction of the programmable time interval. For example, the time resolution Δt is 1 ms. In one example, the tachometer count is a digital representation of a fan speed from the fan module 450. In one example, the tachometer count may be converted to units of revolutions per minute (rpm) to provide a numerical representation of the fan speed from the fan module 450 (not shown).

In one example, the tachometer counter 426 may be configured by a tachometer counter configuration register with M bits (e.g., M=16). In one example, the tachometer timer 425 may be configured by a tachometer timer configuration register with N bits (e.g., N=16). In one example, the tachometer timer 425 is paced by a digital clock signal with a specified frequency accuracy and a specified frequency stability. For example, specified frequency accuracy provides a quantitative metric of a frequency offset relative to an absolute frequency reference. For example, specified frequency stability provides a quantitative metric of a frequency change over a time interval, a temperature range, an operational condition, etc.

In one example, the RPM checker 428 accepts the tachometer count from the tachometer counter 426 and converts it into a numerical value in units of rpm to produce a converted tachometer value. In one example, the RPM checker 428 compares the converted tachometer value to a target RPM value received from a Target_RPM CSR 429a to generate a tachometer measurement message which is placed in a Tachometer_RPM CSR 429b. In one example, the tachometer RPM violation/confirmation interrupt signal 423 sent to the internal fan controller 430 is derived from the tachometer measurement message in the Tachometer_RPM CSR 429b. In one example, the Target_RPM CSR 429a has a size of P bits (e.g., P=16) and the Tachometer_RPM CSR 429b has a size of R bits (e.g., R=16).

Figure 5:
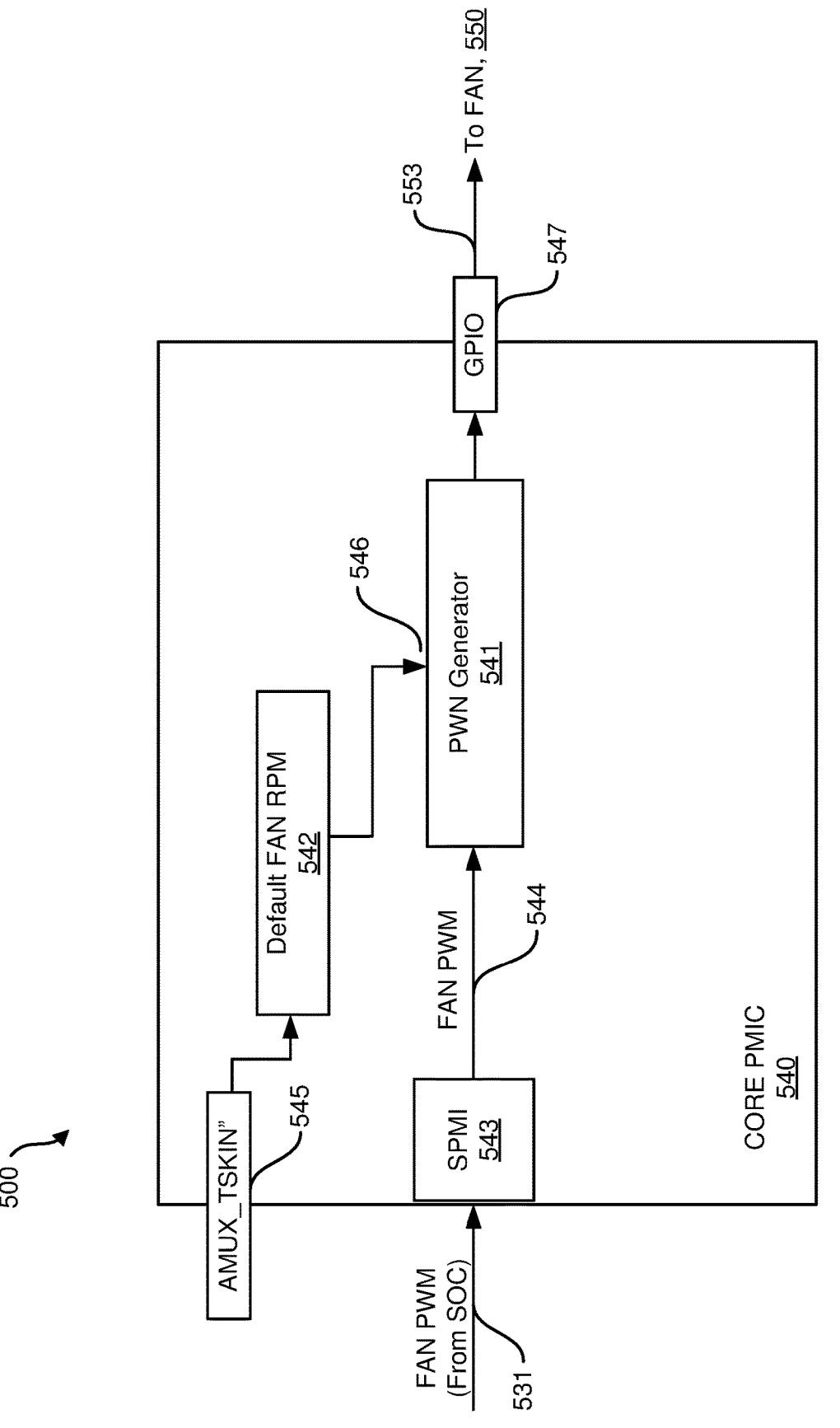
FIG. 5 illustrates an example block diagram of a core power management integrated circuit (PMIC) with a pulse width modulation (PWM) generator.

FIG. 5 illustrates an example block diagram 500 of a core power management integrated circuit (PMIC) with a pulse width modulation (PWM) generator. In one example, the core PMIC 540 receives a fan PWM signal 531 at an input interface 543 (e.g., a SPMI interface) to produce a control PWM signal 544. In one example, the control PWM signal 544 is used in a PWM generator 541 to generate a PWM waveform 553 for the fan module 550 (not shown) at an output interface 547 (e.g., a GPIO interface). In one example, the PWM generator 541 also receives a default fan RPM setting 542 at a second input interface 546. In one example, the default fan RPM setting 542 is initialized at interface 545. In one example, the interface 545 is an analog-digital converter (ADC) channel in the core PMIC 540 which connects to a thermistor which is placed to measure a skin temperature of a printed circuit board (PCB) hardware temperature. In one example, if there is a breach in a measured skin temperature, then the core PMIC 540 will enable the fan in the default fan RPM setting 542.

In one example, the PWM generator 541 controls the fan speed for the fan module 550 by generating the PWM waveform 553 with a switching frequency $f_{SW}$ which is configured between a minimum switching frequency $f_{MIN}$ (e.g., 20 kHz) and a maximum switching frequency $f_{MAX}$ (e.g., 50 kHz).

In one example, the PWM generator 541 is required to drive the output interface 547. In one example, the output interface 547 is capable of an optional internal voltage pull-up to a primary voltage signal for the PWM waveform 553. In one example, the required output interface 547 may be available in the core PMIC 540. In one example, the core PMIC 540 may be used to generate the PWM waveform 553 if a SOC is unavailable to perform active fan control.

In one example, if there are a quantity of X fans in the fan module 550, then a quantity of X PWM generators are needed to control each fan of the quantity of X fans. For example, if there are two fans in the fan module 550, then a quantity of two PWM generators are needed.

Figure 6:
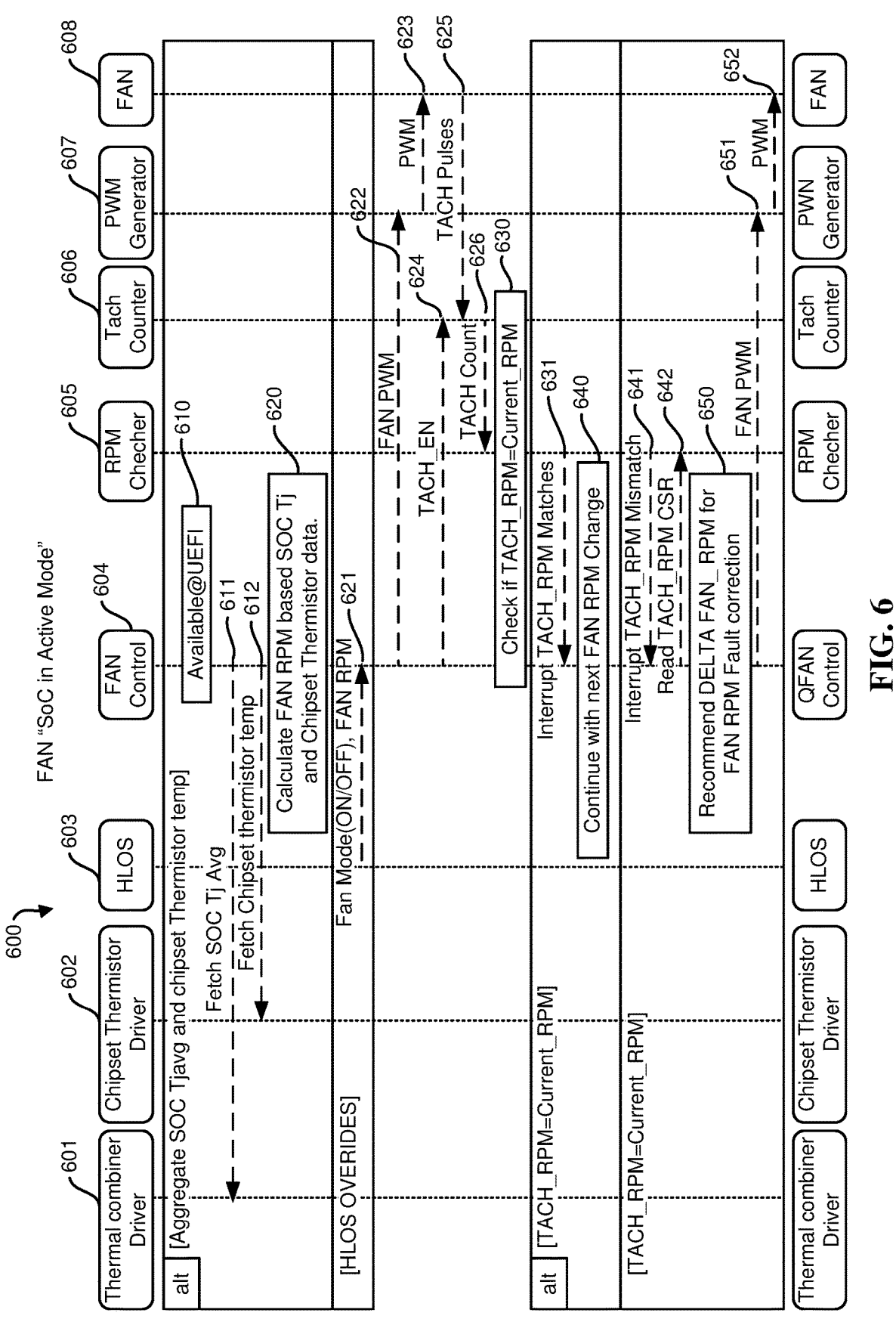
FIG. 6 illustrates an example operational flow diagram for active thermal control with a system on a chip (SOC) in active mode.

FIG. 6 illustrates an example operational flow diagram 600 for active thermal control with a system on a chip (SOC) in active mode. Shown in FIG. 6 are the following agents for the operational flow: thermal combiner driver 601, chipset thermistor driver 602, high level operating system (HLOS) 603, internal fan controller (e.g., Fan Control) 604, RPM checker 605, tachometer counter 606, PWM generator 607, and fan 608.

In one example, the operational flow commences with a processor initialization state 610 (e.g., Available @UEFI state). In 611, a SOC average temperature fetch request is sent from the internal fan controller 604 to the thermal combiner driver 601. In 612, a chipset thermistor temperature fetch request is sent from the internal fan controller 604 to the chipset thermistor driver 602.

Next, the operational flow continues with a calculated fan speed state 620 using the SOC average temperature and the chipset thermistor temperature. In one example, the SOC average temperature and the chipset thermistor temperature are obtained in response to the SOC average temperature fetch request and the chipset thermistor temperature fetch request. In 621, a fan mode (ON/OFF) directive and a fan speed (e.g., FAN RPM) directive are sent from the HLOS 603 to the internal fan controller 604. In 622, a fan control PWM signal is sent from the internal fan controller 604 to the PWM generator 607. In 623, a PWM waveform, based on the fan control PWM signal, is sent from the PWM generator 607 to the fan 608. In 624, a tachometer enable (TACH_EN) signal is sent from the internal fan controller 604 to the tachometer counter 606. In 625, tachometer pulses are sent from the fan 608 to the tachometer counter 606. In 626, a tachometer count is sent from the tachometer counter 606 to the RPM checker 605.

Next, the operational flow continues with a check tachometer speed state 630. In one example, the check tachometer speed state 630 compares a measured tachometer speed (e.g., TACH_RPM) derived from the tachometer count with a target fan speed (i.e., target RPM value).

If the measured tachometer speed matches the target fan speed, then at 631, a tachometer speed match interrupt signal (i.e., Interrupt TACH_RPM Matches) is sent from the RPM checker 605 to the internal fan controller 604. Next, the operational flow continues with a next fan speed state 640 where the operation continues with a successive fan speed change.

If the measured tachometer speed does not match the target fan speed, then at 641, a tachometer speed mismatch interrupt signal (i.e., Interrupt TACH_RPM Mismatch) is sent from the RPM checker 605 to the internal fan controller 604. In 642, a read tachometer speed request (i.e., Read TACH_RPM CSR) is sent from the internal fan controller 604 to the RPM checker 605.

Next, the operational flow continues with a fan speed correction state 650 where a recommended differential fan speed is derived to correct a fan speed error. In one example, the fan speed error is a difference between the measured tachometer speed and the target fan speed. In 651, an updated fan control PWM signal is sent from the internal fan controller 604 to the PWM generator 607. In 652, an updated PWM waveform, based on the updated fan control PWM signal, is sent from the PWM generator 607 to the fan 608.

In one example, an internal fan controller retrieves SOC temperature measurements from a thermal combiner module and chipset thermistor temperature measurements from a chipset thermistor driver circuit. In one example, the internal fan controller processes the SOC temperature measurements and the chipset thermistor temperature measurements and determines a fan PWM signal which is used to convey a fan speed directive based on a performance mode. For example, the performance mode may include a plurality of dedicated lookup tables (LUTs) for each chipset thermistor and for the SOC temperature measurements. In one example, the internal fan controller calculates a fan speed from each LUT of the plurality of dedicated LUTs for a given performance mode and a maximum fan speed is selected.

In one example, the internal fan controller converts the maximum fan speed to a fan PWM signal which is conveyed to a PMIC via an output interface (e.g., SPMI). In one example, the PMIC generates a control PWM signal based on the fan PWM signal.

Figure 7:
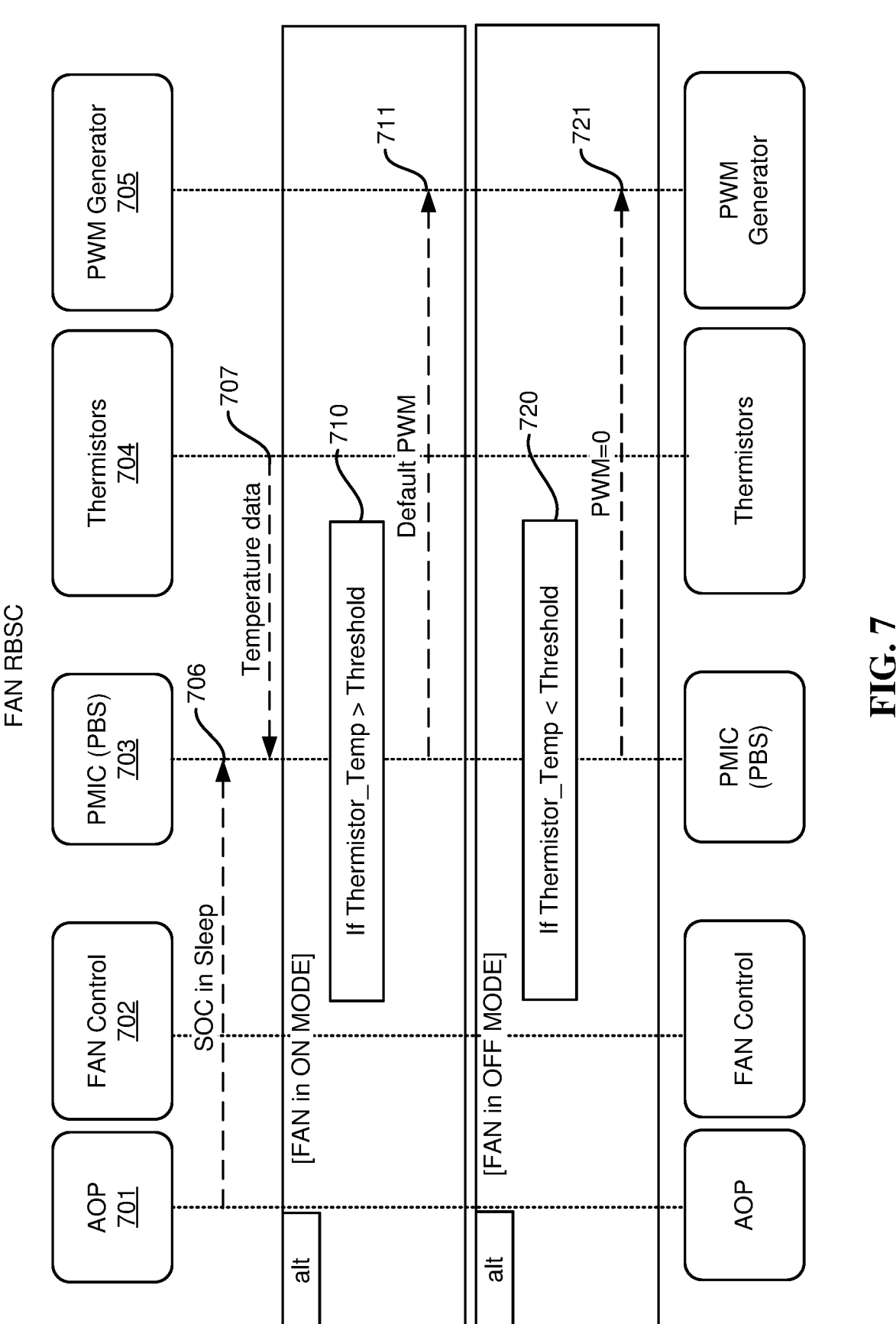
FIG. 7 illustrates an example operational flow diagram for active thermal control with a system on a chip (SOC) in sleep mode.

FIG. 7 illustrates an example operational flow diagram 700 for active thermal control with a system on a chip (SOC) in sleep mode. Shown in FIG. 7 are the following agents for the operational flow: always on processor (AOP) 701, internal fan controller 702, PMIC 703, a plurality of thermistors 704, and a PWM generator 705.

In one example, the operational flow commences with 706 where a SOC in sleep mode alert signal is sent from the AOP 701 to the PMIC 703. In 707, temperature data are sent from the plurality of thermistors 704 to the PMIC 703.

Next, to determine an ON mode, the operational flow continues with a first thermistor temperature comparison state 710. In one example, if at least one temperature from the temperature data is greater than a predetermined temperature threshold, then in 711 send a default control PWM signal from the PMIC 703 to the PWM generator 705. In one example, the default control PWM signal enables a default PWM waveform for a fan (i.e., the fan is turned on).

Next, to determine an OFF mode, the operational flow continues with a second thermistor temperature comparison state 720. In one example, if at least one temperature from the temperature data is less than the predetermined temperature threshold, then in 721 send a null control PWM signal from the PMIC 703 to the PWM generator 705. In one example, the null control PWM signal disables a default PWM waveform for the fan (i.e., the fan is turned off).

In one example, a PMIC detects a SOC in sleep mode (e.g., rock bottom sleep current (RBSC) based on a CSR setting. In one example, the PMIC initiates control of a fan speed. In one example, the PMIC has access to chipset thermistor data, such as SOC thermistor temperature, charging thermistor temperature, back cover thermistor temperature and other chipset thermistor temperatures (e.g., hot spot temperatures).

In one example, the PMIC has access to a threshold value for each thermistor to determine a mode selection. In one example, the mode selection is between a Fan On mode (e.g., default fan speed mode) and a Fan Off mode. In one example the Fan On mode may be set to a fixed fan speed which may be set to a desired fan speed based on a characterization of sufficient fan speed for a given skin temperature. In one example, the characterization depends on each platform and fan type.

FIG. 8 illustrates an example flow diagram 800 for active thermal control of a system on a chip (SOC). In block 810, retrieve one or more internal temperature measurements from a plurality of thermal sensors. That is, one or more internal temperature measurements is retrieved from a plurality of thermal sensors. In one example, the one or more internal temperature measurements may include a SOC temperature and/or a chipset temperature.

In block 820, determine a control pulse width modulation (PWM) signal based on the one or more internal temperature measurements and based on a tachometer revolutions per minute (RPM) violation/confirmation interrupt signal. That is, a control pulse width modulation (PWM) signal is determined based on the one or more internal temperature measurements and based on a tachometer revolutions per minute (RPM) violation/confirmation interrupt signal.

In one example, the tachometer RPM violation/confirmation interrupt signal is based on a fan speed measurement derived from fan speed feedback. In one example, the fan speed measurement is derived by an internal tachometer. In one example, the tachometer RPM violation/confirmation interrupt signal is based on a comparison of the fan speed measurement and a target RPM value. In one example, the control PWM signal is determined by a thermal control algorithm based on a SOC temperature interrupt signal and a chipset temperature interrupt signal. In one example, the thermal control algorithm is also based on the tachometer RPM violation/confirmation interrupt signal.

In one example, the fan speed measurement employs a tachometer timer to provide a programmable time interval for a tachometer counter. In one example, the tachometer timer is paced by a digital clock signal with a specified frequency accuracy and a specified frequency stability. In one example, the control PWM signal depends on knowledge of active user applications and use cases and direct knowledge of an internal temperature state. In one example, knowledge of active user applications and use cases means that current processing activity in the SOC provides information on internal thermal energy consumption. In one example, direct knowledge of the internal temperature state means that internal temperature measurements are used to determine the internal temperature state.

In block 830, generate a pulse width modulation (PWM) waveform based on the control PWM signal. That is, a pulse width modulation (PWM) waveform is generated based on the control PWM signal. In one example, the PWM waveform is a periodic pulse train with a switching frequency and with variable pulse width used to regulate a thermal control duty cycle. In one example, the switching frequency is configured between a minimum switching frequency $f_{MIN}$ (e.g., 20 kHz) and a maximum switching frequency $f_{MAX}$ (e.g., 50 kHz). In one example, the thermal control duty cycle regulates a thermal control device. In one example, the thermal control device is a heater, a fan, a heat pipe, etc.

In block 840, deliver the pulse width modulation (PWM) waveform to a fan to steer a fan speed of the fan towards a target fan speed. That is, the pulse width modulation (PWM) waveform is delivered to a fan to steer a fan speed of the fan towards a target fan speed. In one example, the fan is a component of the fan module 350 (shown in FIG. 3). In one example, the steering is performed by incorporating fan speed feedback from the fan to an internal fan controller which incorporates a closed loop control process. In one example, the fan includes a tachometer to indicate the fan speed of the fan by generating tachometer pulses. In one example, the generated tachometer pulses have a pulse rate commensurate with the fan speed of the fan.

In block 850, provide one or more tachometer pulses from the fan as a fan speed feedback to an internal tachometer. That is, one or more tachometer pulses is provided from the fan as a fan speed feedback to an internal tachometer. In one example, the one or more tachometer pulses are counted by a tachometer counter. In one example, the tachometer counter is synchronized by a tachometer timer.

Figure 9:
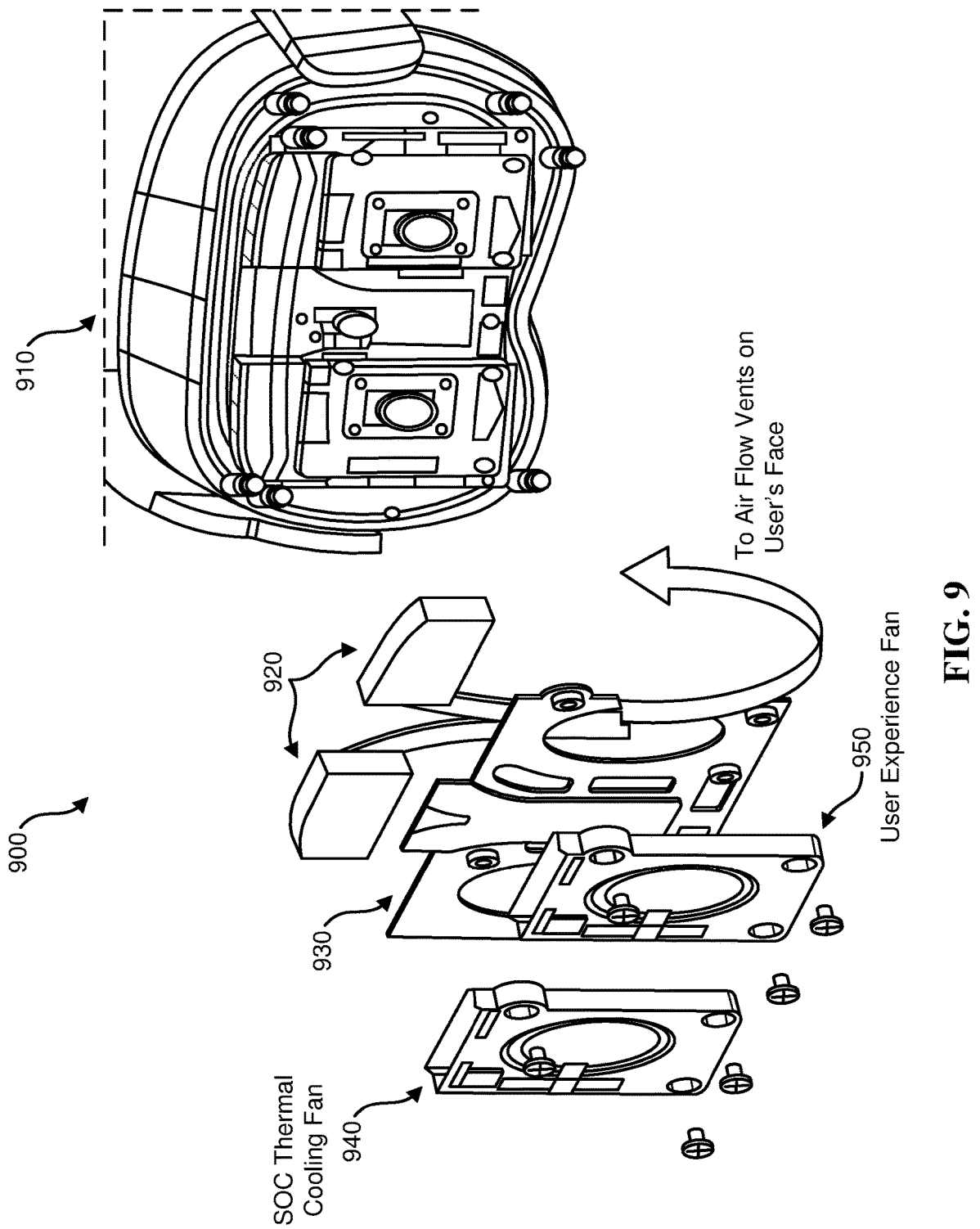
FIG. 9 illustrates an example virtual reality (VR) scenario.

In one example, the active thermal control of a SOC described in FIG. 8 may also be employed in a virtual reality (VR) scenario which employs user goggles in an immersive environment. FIG. 9 illustrates an example virtual reality (VR) scenario 900. In one example, the VR scenario 900 includes user goggles 910, air flow vents 920, a mounting structure 930, a SOC thermal cooling fan 940 and a dedicated user experience fan 950.

In one example, active thermal control of a SOC as described in FIG. 8 may drive a dedicated user experience fan 950 at a required fan speed for an immersive VR user experience. In one example, a user application, such as gaming software, may control the dedicated user experience fan 950 using the active thermal control of the SOC. In one example, based on required air flow velocity, the required fan speed may be controlled by a HLOS in the SOC. In one example, an internal fan controller interface may enable a control path directly from the SOC without requiring any additional external components or hardware.

In one example, SOC fan heat pipes may carry cooling air to the SOC and the dedicated user experience fan 950 may transport air flow for a user face. In one example, the required fan speed defines how much air flow is designed for a user air flow experience. In one example, a plurality of fans may be supported and designed for a more realistic user experience.

In one aspect, one or more of the steps for providing active thermal control for a system on a chip (SOC) in FIG. 8 may be executed by one or more processors which may include hardware, software, firmware, etc. The one or more processors, for example, may be used to execute software or firmware needed to perform the steps in the flow diagram of FIG. 8. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

One skilled in the art would understand that various features of different embodiments may be combined or modified and still be within the spirit and scope of the present disclosure.

What is claimed is:

1. An apparatus comprising:
an internal fan controller configured to generate a fan pulse width modulation (PWM) signal, wherein the internal fan controller is integrated as part of a system on a chip (SOC);
a fan module configured to generate one or more tachometer pulses; and
an internal tachometer coupled to the internal fan controller and the fan module, the internal tachometer configured to receive the one or more tachometer pulses from the fan module, wherein the internal tachometer is integrated as part of the system on a chip (SOC).

2. The apparatus of claim 1, further comprising a core power management integrated circuit (PMIC) coupled to the internal fan controller, the core PMIC configured to receive the fan PWM signal and to generate a control pulse width modulation (PWM) signal based on the fan PWM signal.

3. The apparatus of claim 2, further comprising a pulse width modulation (PWM) generator configured to generate a pulse width modulation (PWM) waveform based on the control PWM signal.

4. The apparatus of claim 3, wherein the fan module is further configured to receive the PWM waveform.

5. The apparatus of claim 4, wherein the fan module comprises a fan.

6. The apparatus of claim 5, wherein the fan module is further configured to use the PWM waveform to steer a fan speed of the fan towards a target fan speed.

7. The apparatus of claim 6, wherein the fan module is further configured to provide the one or more tachometer pulses as a fan speed feedback to the internal tachometer.

8. The apparatus of claim 7, further comprising a tachometer counter configured to count the one or more tachometer pulses, wherein the tachometer counter is a component of the internal tachometer.

9. The apparatus of claim 8, further comprising a tachometer timer configured to synchronize the tachometer counter, wherein the tachometer timer is a component of the internal tachometer.

10. The apparatus of claim 9, wherein the tachometer timer is further configured to provide a programmable time interval for the tachometer counter.

11. The apparatus of claim 7, wherein the internal tachometer is further configured to derive a fan speed measurement from the fan speed feedback.

12. The apparatus of claim 11, wherein the internal tachometer is further configured to generate a tachometer revolutions per minute (RPM) violation/confirmation interrupt signal based on a comparison of the fan speed measurement and a target RPM value.

13. The apparatus of claim 2, wherein the internal fan controller is further configured to use a thermal control algorithm for determining the control PWM signal.

14. The apparatus of claim 13, wherein the thermal control algorithm is based on a system on a chip (SOC) temperature interrupt signal and a chipset temperature interrupt signal.

15. A method comprising:
determining a control pulse width modulation (PWM) signal based on one or more internal temperature measurements and based on a tachometer revolutions per minute (RPM) violation/confirmation interrupt signal;
generating a pulse width modulation (PWM) waveform based on the control PWM signal;

delivering the pulse width modulation (PWM) waveform to a fan to steer a fan speed of the fan towards a target fan speed; and providing one or more tachometer pulses from the fan as a fan speed feedback to an internal tachometer.

16. The method of claim 15, further comprising retrieving the one or more internal temperature measurements from a plurality of thermal sensors.

17. The method of claim 16, wherein the one or more internal temperature measurements include a system on a chip (SOC) temperature or a chipset temperature.

18. The method of claim 15, further comprising deriving a fan speed measurement from the fan speed feedback.

19. The method of claim 18, wherein the tachometer RPM violation/confirmation interrupt signal is based on the fan speed measurement.

20. The method of claim 18, wherein the tachometer RPM violation/confirmation interrupt signal is based on a comparison of the fan speed measurement and a target RPM value.

21. The method of claim 18, further comprising using a thermal control algorithm for determining the control PWM signal.

22. The method of claim 21, wherein the thermal control algorithm is based on a system on a chip (SOC) temperature interrupt signal and a chipset temperature interrupt signal.

23. The method of claim 21, wherein the thermal control algorithm is based on the tachometer RPM violation/confirmation interrupt signal.

24. The method of claim 15, wherein the PWM waveform is a periodic pulse train.

25. The method of claim 24, wherein the periodic pulse train includes a switching frequency and includes a variable pulse width.

26. The method of claim 25, further comprising using the PWM waveform to regulate a thermal control duty cycle.

27. The method of claim 15, further comprising incorporating a closed loop control process to incorporate the fan speed feedback from the fan to an internal fan controller.

28. An apparatus for providing active thermal control for a system on a chip (SOC), the apparatus comprising:

means for determining a control pulse width modulation (PWM) signal based on one or more internal temperature measurements and based on a tachometer revolutions per minute (RPM) violation/confirmation interrupt signal;

means for generating a pulse width modulation (PWM) waveform based on the control PWM signal;

means for delivering the pulse width modulation (PWM) waveform to a fan to steer a fan speed of the fan towards a target fan speed;

means for providing one or more tachometer pulses from the fan as a fan speed feedback to an internal tachometer; and a plurality of thermal sensors configured for retrieving the one or more internal temperature measurements.

29. The apparatus of claim 28, further comprising means for using a thermal control algorithm for determining the control PWM signal, wherein the thermal control algorithm is based on a system on a chip (SOC) temperature interrupt signal and a chipset temperature interrupt signal.

30. A non-transitory computer-readable medium storing computer executable code, operable on a device comprising at least one processor and at least one memory coupled to the at least one processor, wherein the at least one processor is configured to implement active thermal control for a system on a chip (SOC), the computer executable code comprising:

instructions for causing a computer to determine a control pulse width modulation (PWM) signal based on one or more internal temperature measurements and based on a tachometer revolutions per minute (RPM) violation/confirmation interrupt signal;

instructions for causing the computer to generate a pulse width modulation (PWM) waveform based on the control PWM signal;

instructions for causing the computer to deliver the pulse width modulation (PWM) waveform to a fan to steer a fan speed of the fan towards a target fan speed;

instructions for causing the computer to provide one or more tachometer pulses from the fan as a fan speed feedback to an internal tachometer;

instructions for causing the computer to retrieve the one or more internal temperature measurements from a plurality of thermal sensors; and instructions for causing the computer to use a thermal control algorithm for determining the control PWM signal, wherein the thermal control algorithm is based on a system on a chip (SOC) temperature interrupt signal and a chipset temperature interrupt signal.

* * * * *